United States Patent [19]

Stevenson et al.

[11] 3,819,974

[45] June 25, 1974

[54] GALLIUM NITRIDE METAL-SEMICONDUCTOR JUNCTION LIGHT EMITTING DIODE

[76] Inventors: David A. Stevenson, 331 Lincoln Ave., Palo Alto, Calif. 94301; Walden C. Rhines, 9321 Forest Ln., Apt. 1096, Dallas, Tex. 85231; Herbert P. Maruska, 2326 California St., No. 39, Mountain View, Calif. 94040

[22] Filed: Mar. 12, 1973

[21] Appl. No.: 340,539

[52] U.S. Cl. ... 313/499, 317/235 UA, 317/235 AD

[51] Int. Cl. ... H05b 33/14

[58] Field of Search ... 313/108 D; 317/235 UA, 317/235 AD; 331/94.5 H

[56] References Cited

UNITED STATES PATENTS 3,404,305 10/1968 Wright ... 313/108 D 3,462,630 8/1969 Cuthbert et al. ... 313/108 D

*Primary Examiner*—Herman Karl Saalbach
*Assistant Examiner*—Siegfried H. Grimm
*Attorney, Agent, or Firm*—Flehr, Hohbach, Test, Albritton & Herbert

[57] ABSTRACT

A light emitting diode comprising a first layer of gallium nitride, a second, substantially intrinsic layer of magnesium doped gallium nitride forming a junction therewith, a metallic rectifying contact to the second layer, an ohmic contact to the first layer, and means for applying a voltage across said contacts and said junctions whereby to bias the device and generate light.

4 Claims, 7 Drawing Figures

GALLIUM NITRIDE METAL-SEMICONDUCTOR JUNCTION LIGHT EMITTING DIODE

GOVERNMENT CONTRACT

The invention described herein was made in the performance of work under a research grant from the Advanced Research Projects Agency.

BACKGROUND OF THE INVENTION

This invention relates generally to light emitting diodes and more particularly to a violet light emitting diode.

Undoped gallium nitride always occurs highly n-type ($n > 10^{18}$ cm$^{-3}$) and thus far has not been made conducting p-type. However, a deep acceptor such as zinc has been utilized to compensate the donors and produce insulating gallium nitride crystals. This dopant can be introduced during the growth of the gallium nitride crystal. When the dopant is introduced after initial deposition of undoped material, an i-n junction is formed. In the prior art, red, yellow, green and blue light emitting diodes have been obtained with zinc doped insulating regions forming *i-n* junctions.

OBJECTS AND SUMMARY OF THE INVENTION

It is a general object of the present invention to provide a violet light emitting diode.

It is another object of the present invention to provide a violet light emitting diode formed by a rectifying metal contact to an intrinsic magnesium doped layer of gallium nitride forming a junction with a gallium nitride layer.

The foregoing and other objects of the invention are achieved by a light emitting diode comprising a first layer of gallium nitride, a second layer of magnesium doped gallium nitride forming a junction therwith, a metal layer forming a rectifying junction with the second layer, and means for applying a voltage across said junctions to generate and emit light.

DESCRIPTION OF PREFERRED EMBODIMENT

Figure 1:
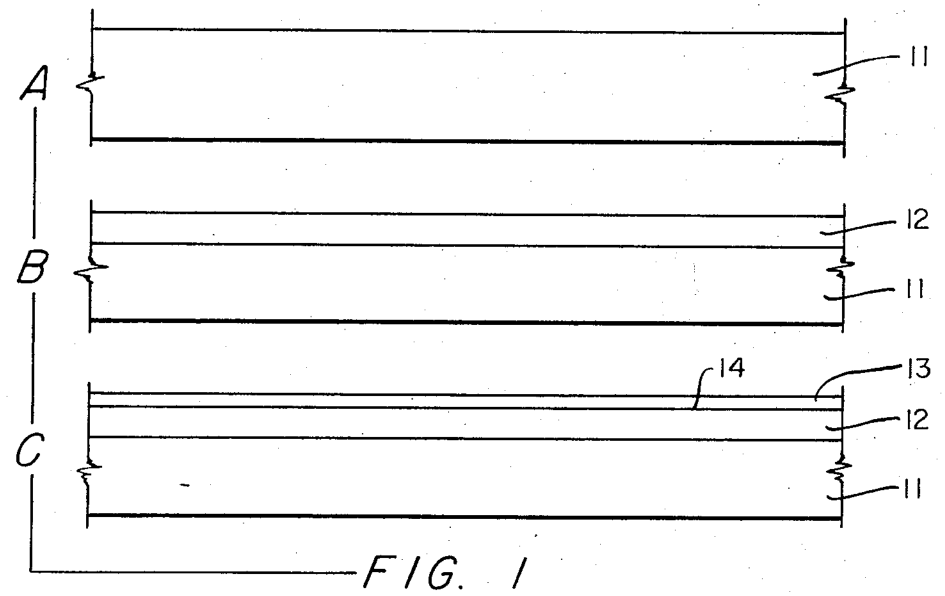
FIG. 1 shows the steps in the growing of a layered device in accordance with the invention.
Figure 2:
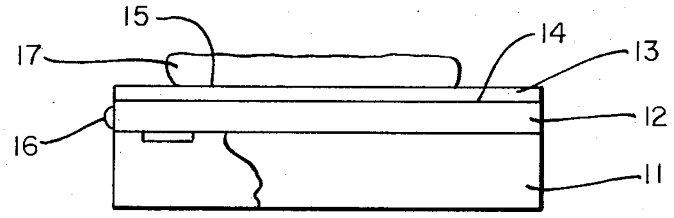
FIG. 2 shows the step of forming ohmic contacts with the device regions.

Referring to FIG. 1, the steps of forming a junction gallium nitride light emitting diode are illustrated. A wafer or slice of single crystal flame-fusion-grown sapphire may be used as the substrate 11. A layer of highly n-type gallium nitride 12 is formed on one surface of the wafer 11 by transporting gallium as its gaseous monochloride and introducing nitrogen into the growth zone in the form of ammonia, both at an elevated temperature (approximately 900°–950°C.) whereby there is epitaxially grown the GaN layer 12. The thickness of the n-type layer is typically 100 microns with an approximate range of thickness between 50 and 200 microns ($\mu$). The gallium nitride is formed by the reaction $$GaCl + NH_3 = GaN + HCl + H_2$$

After growth of the region 12, the atmosphere is doped by introducing metallic magnesium while the layer is being grown to form a magnesium doped gallium nitride layer 13. The dopant atoms compensate the normally n-type growth to form a substantially intrinsic GaN:Mg layer 13. The layer 13 forms an *i-n* junction 14 with the layer 12. The magnesium is added by placing magnesium in a graphite crucible and maintaining it at approximately 710°C while passing thereover nitrogen gas. This transports the elemental magnesium atoms into the growth zone where they deposit as an impurity or dopant with the gallium nitride to form the intrinsic GaN:Mg region 13. The introduction of Mg produces an energetically deep (many kT above the valence band) acceptor level which compensates the native donors in GaN, thus making it intrinsic. The thickness of this intrinsic, *i*, layer 13 is typically 10$\mu$, with a possible range of 5–20$\mu$ and the magnesium concentration in the layer is typically 0.15 weight percent ($10^{20}$ atoms cm$^{-3}$) as determined by electron microprobe analysis, with a possible range of $5 \times 10^{19}$ to $10^{21}$ atoms cm$^{-3}$.

After the formation of the slice shown in FIG. 1C, the slice is cut up or diced to form devices of predetermined size. A metal layer 17, 100$\mu$ thickness or larger, is deposited onto the surface of the intrinsic layer to form a second *m-i* rectifying junction 15 with the intrinsic layer. Various metals and deposition techniques may be utilized. For example, an indium-mercury amalgam may be painted on the surface of the magnesium-doped gallium nitride region 13. The chip is then heated for about a minute at 400°C to drive off the mercury. This leaves a solid indium layer. Other metals, such as Al, Au, Pt and Ag, may be deposited as a layer 17 by vacuum evaporation, chemical vapor deposition or by sputtering. Similar techniques are used to produce a metal ohmic contact 16 on the edge of the *n* layer 12. A variant in this structure consists of the removal of a portion of the sapphire substrate or the intrinsic layer whereby contact may be made to a portion of the surface of the *n*-type layer 16.

Figure 3:
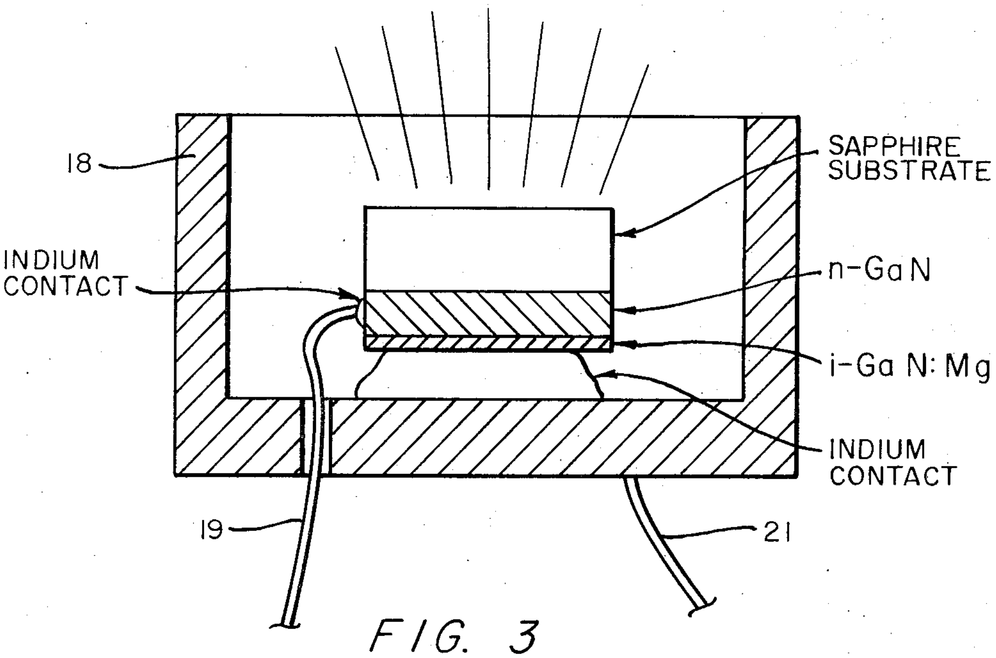
FIG. 3 shows a device in accordance with the invention mounted in a metallic support.

The device may be placed in a holder 18 such as shown in FIG. 3 comprising a cup-shaped metal holder. One surface of the indium contact 17 forms ohmic connection with the holder. Leads 19 and 21 provide electrical connection to the indium contact 16 and holder 18 for application of voltage across the region 13 and junctions 14 and 15.

Figure 4:
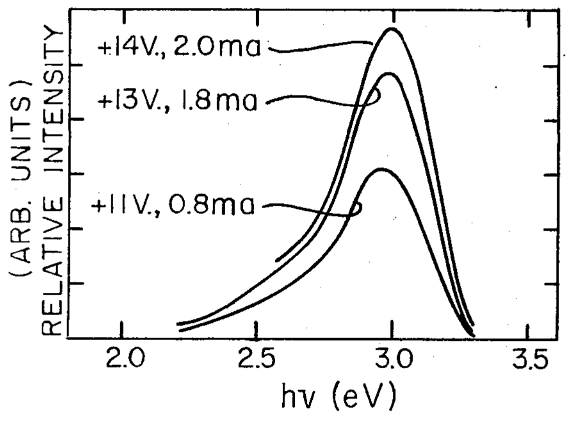
FIG. 4 shows the electroluminescence spectrum with forward bias.
Figure 5:
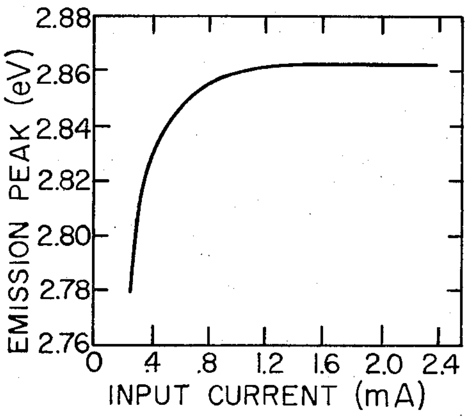
FIG. 5 shows the shift of forward bias electroluminescent peak with input current.
Figure 6:
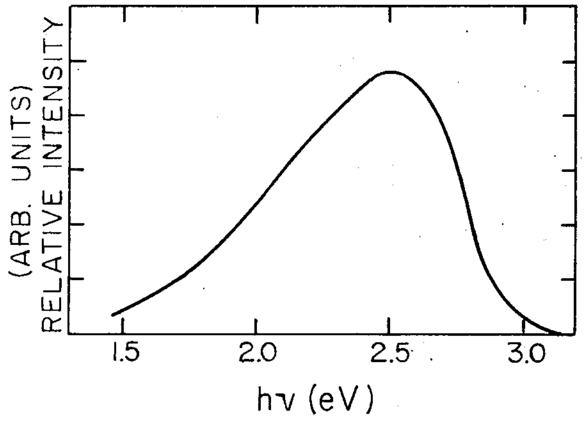
FIG. 6 shows the electroluminescence spectrum with reverse bias.
Figure 7:
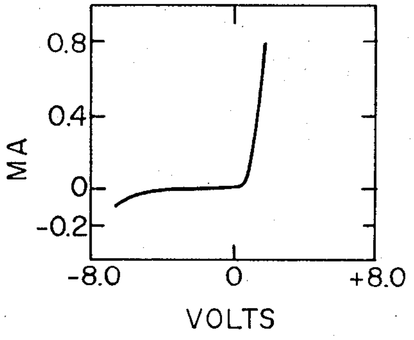
FIG. 7 shows typical current voltage characteristics for the device.

In a device constructed in accordance with the foregoing, electroluminescence or light generation is obtained both with forward and reverse bias, that is, with the *i*-layer bias either positive or negative. The forward bias voltage is more efficient. In the forward direction, substantial conduction begins at 10 volts and the violet light is readily seen in a well lit room at 20 volts. Under reverse bias, conduction occurs in 40 – 60 volt range and produces a greenish light. Emission under forward bias electroluminescence peaked in the region of 2.86 – 2.98 electron volts in various samples. The spectral width of half maximum is about 400 meV. A typical spectrum is shown in FIG. 4. It is seen that the peak shifts to shorter wavelength with increasing current until a saturation value is reached; an example of the saturation is shown in FIG. 5 wherein emission peak versus input current is shown. The voltage current characteristics of a device constructed in accordance with the foregoing is shown in FIG. 7. The reverse bias light emission is shown in FIG. 6. Although the emitted light appears uniform to the unaided eye, it actually consists of an array of spots in the size range of 5 – 25$\mu$ with an inter-spot distance of 100 – 200$\mu$, as determined by high resolution optical microscopy. The luminescence is believed to be the result of field-emission of electrons trapped by the Mg acceptor levels, with subsequent recombination of electrons to the then empty levels left by the field-emission. This process occurs in regions of high electric field. It has been determined by scanning electron microscopy that a high electric field occurs at the *i-n* junction with forward bias, and at the *m-i* junction with reverse bias. The fact that these two junctions are expected to have different characteristics is responsible for the shift in the peak of the luminescence in going from forward to reverse bias.

Thus, it is seen that there has been provided an improved light emitting diode capable of emitting light in the violet region of the spectrum. This device may be used as a source of violet light for applications where this spectral range is appropriate. This light may be converted to lower frequencies (lower energy) with good conversion efficiency using organic and inorganic phosphors. Such a conversion is appropriate not only to develop different colors for aesthetic purposes, but also to produce light in a spectral range of greater sensitivity for the human eye. By use of different phosphors, all the primary colors may be developed from this same basic device. An array of such devices may be used for color display systems; for example, a solid state TV screen.

We claim:

1. A light emitting diode comprising a first region of gallium nitride, a second region of magnesium doped gallium nitride on one surface thereof forming a rectifying junction therewith, a metal forming a rectifying junction with the second region, and means forming ohmic contact to said first region whereby a voltage can be applied to said metal and said means forming ohmic contact to apply a voltage across said junctions.

2. A light emitting diode as in claim 1 wherein said magnesium has a concentration in the range of $5 \times 10^{19}$ to $10^{21}$ atoms/cm$^3$.

3. A light emitting diode as in claim 2 wherein said second layer has a thickness in the range of 5 to 20 microns.

4. The method of generating violet light which comprises the steps of trapping electrons in magnesium acceptors in an intrinsic gallium nitride layer, causing removal of said electrons from said acceptors by applying an electric field of sufficient magnitude to remove the electrons, and causing electrons to recombine with said magnesium acceptors whereby to generate violet light.

* * * * *